US006704826B1

(12) United States Patent
Lam et al.

(10) Patent No.: US 6,704,826 B1
(45) Date of Patent: Mar. 9, 2004

(54) DIGITAL SIGNAL ISOLATION

(75) Inventors: An H. Lam, Houston, TX (US); Wiley R. Flanakin, Cypress, TX (US); Sompong Paul Olarig, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 399 days.

(21) Appl. No.: 09/666,817

(22) Filed: Sep. 21, 2000

(51) Int. Cl.[7] .............................................. G06F 13/00
(52) U.S. Cl. ..................... 710/302; 327/379; 327/488
(58) Field of Search ................................ 710/302, 305; 327/365, 379, 419, 437, 488

(56) References Cited

U.S. PATENT DOCUMENTS 6,169,801 B1 * 1/2001 Levasseur et al. .......... 379/413
6,434,633 B1 * 8/2002 Braun et al. ................. 710/15

* cited by examiner

Primary Examiner—Glenn A. Auve

(57) ABSTRACT

A digital isolation circuit comprises a plurality of CMOS transistors. The transistors may be connected together to form either a logic NAND gate or a logic NOR gate, but the isolation circuits preferably are not used to provide the NAND or NOR logic functions. The isolation circuit isolates one input data signal from an output signal in response to a control input signal. If the control signal is driven to one state (e.g., logic 1), the isolation circuit can be made to function as an inverter when no isolation is needed. In the opposite logic state, the control signal causes the isolation circuit to isolate the input data signal from the output signal.

45 Claims, 4 Drawing Sheets

DIGITAL SIGNAL ISOLATION

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to isolation of digital signals. More particularly, the invention relates to the use of CMOS logic gates to isolate two or more digital circuits from each other. The invention also relates to isolating "hot plug" digital circuits.

2. Background of the Invention

In digital electronic systems, such as computer systems, that have power conservation capability, power is sometimes turned off to part of the system that is not being used, while other parts of the system remain on and functional. Laptop computers, for example, can transition automatically to a power state in which the display and hard drive are turned off to conserve power if the computer has been inactive for a predetermined period of time (e.g., 5 minutes). Many desktop systems also have this capability.

It is commonly assumed that digital signals provided by the un-powered circuit in the computer system are at a logic zero state. However, if the un-powered circuit does not share a common electrical ground with the powered circuit, the output signal lines from the un-powered circuit could float relative to the ground voltage of the powered circuit. These floating signals can cause undesirable effects on the system. For instance, current may flow on the floating signal lines from the un-powered circuit, thereby hastening the drain on the battery in a battery powered laptop computer. Further, undesirable signal oscillations can result from the floating signals. Accordingly, there is a need to solve these problems.

BRIEF SUMMARY OF THE INVENTION

The problems noted above are solved in large part by a digital isolation circuit that comprises a plurality of CMOS transistors. The transistors may be connected together to form either a logic NAND gate or a logic NOR gate, but the isolation circuits preferably are not used to provide the NAND or NOR logic functions. The isolation circuit isolates one input data signal from an output signal in response to a control input signal. If the control signal is driven to one state (e.g., logic 1), the isolation circuit can be made to function as an inverter when no isolation is needed. In the opposite logic state, the control signal causes the isolation circuit to isolate the input data signal from the output signal. The digital isolation circuit solves the problems noted above.

The digital isolation circuit also can be used in a system to isolate hot plug devices from the rest of the system. In this situation, the isolation circuit has the added benefit that solid state switches, prevalent in conventional connection topologies, can be eliminated if the digital isolation circuit of the preferred embodiment is used. These and other benefits will become apparent upon reviewing the following disclosure and accompanying drawings.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION OF THE PREFERRED EMBODIMENTS

Figure 1:
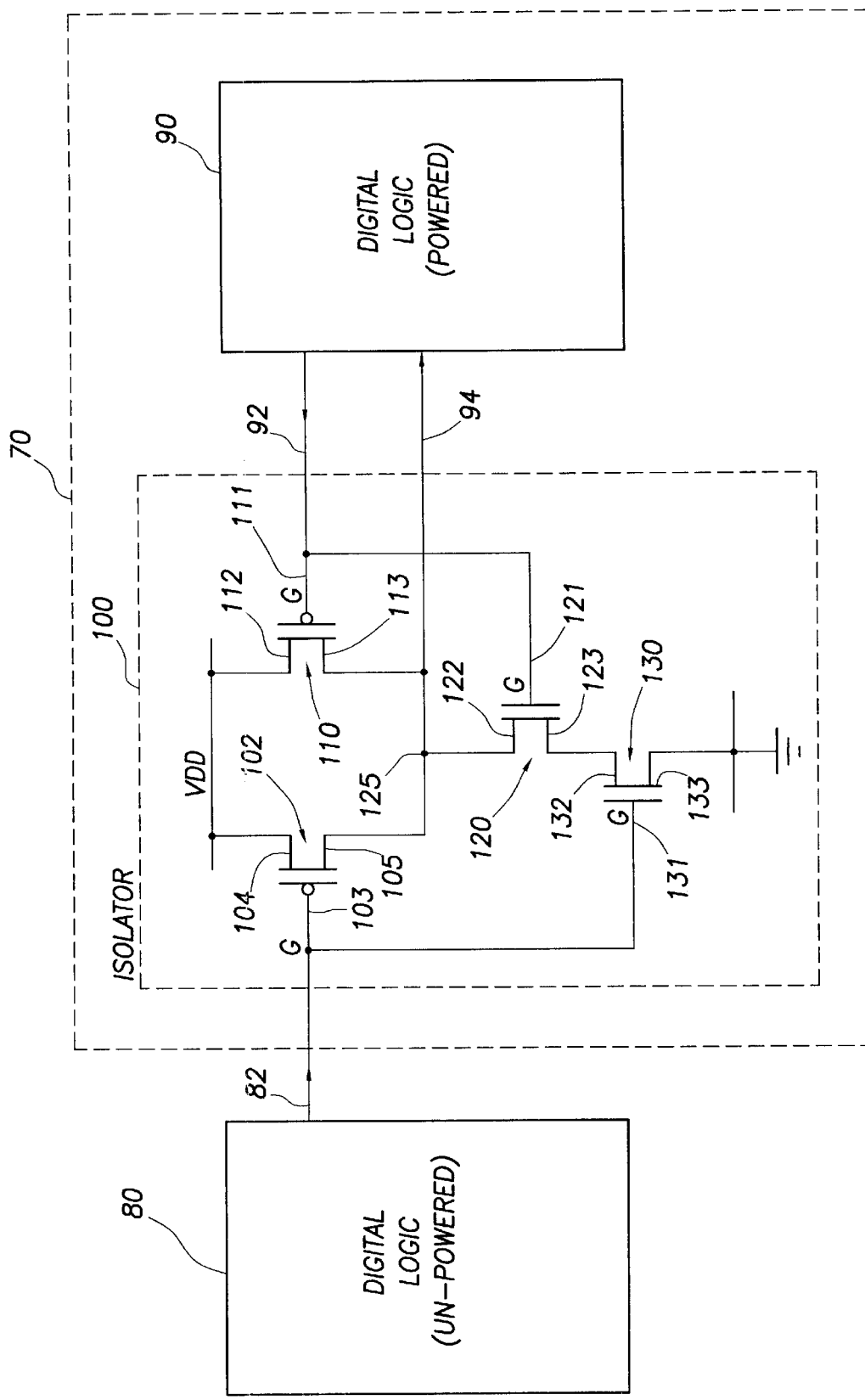
FIG. 1 shows a digital isolation circuit in accordance with a preferred embodiment of the invention.

Referring now to FIG. 1, two digital logic circuits 80 and 90 are isolated from each other by a digital isolation circuit 100 constructed in accordance with one preferred embodiment of the invention. Digital isolation circuit 100 is labeled as "isolator" in FIG. 1 and will be referred to as the digital isolator throughout this disclosure for convenience. As shown, digital logic circuit 80 may be turned off while digital logic circuit 90 remains powered. Dashed box 70 is drawn around powered digital logic circuit 90 and isolator 100 to represent that part of the overall system that remains powered even when digital logic 80 is turned off. If digital logic circuit 80 is manufactured on a circuit board separate from digital logic 90, isolator 100 preferably is included on the board that includes digital logic 90. Further, as discussed below, digital isolator 100 can be integrated into the same application specific integrated circuit ("ASIC") that may include digital logic 90, if digital logic 90, in fact, is implemented on an ASIC.

The two digital logic circuits 80 and 90 can perform any desired functions. Further, the circuits can be part of a computer system or other type of digital system. If part of a computer system, the computer system may include various components not shown such as a microprocessor, memory, one or more input/output devices and other known computer system components.

Digital isolator 100 is used to isolate one signal line 82 that ordinarily would be driven by digital logic circuit 80 and received by digital logic circuit 90 as signal 94. Additional signal lines may driven by digital logic circuit 80 to digital circuit 90, but only one is shown for sake of clarity. If other signals are present that require isolation, additional digital isolators 100 can be included.

Digital isolator 100 preferably comprises four transistors 102, 110, 120, and 130 connected as shown. Transistors 102 and 110 preferably are p-channel metal oxide semiconductor ("PMOS") transistors while transistors 120 and 130 preferably are n-channel metal oxide semiconductor ("NMOS") transistors. Given the function performed by digital isolator 100, one of ordinary skill in the art will recognize that other types of transistors can be substituted for transistors 102, 110, 120, and 130.

Input data signal 82 connects to the gate 103 of transistor 102. The terminals 104 and 112 of PMOS transistors 102 and 110 connect together and to a voltage VDD generated by system 70. The terminal 133 of NMOS transistor 130 preferably connects to the ground potential of system 70 as shown. Terminals 105 and 113 of PMOS transistors 102 and 110 preferably connect to terminal 122 of NMOS transistor 120. Node 125 is used as the output signal 94 of digital isolator 100. Terminal 123 of NMOS transistor 120 connects to terminal 132 of NMOS transistor 130. Finally, terminal 103 of PMOS transistor 102 connects to terminal 131 of NMOS transistor 130 and terminal 111 of PMOS transistor 110 connects to terminal 131 of NMOS transistor 120.

The particular digital isolation circuit 100 shown in FIG. 1 happens to be the circuit implementation of a logic NAND gate. However, the circuit preferably is not used to perform the NAND logic function, but instead is used to isolate digital logic circuit 80 from digital logic circuit 90.

Digital isolator 100 is used in the following manner. It should be understood that a PMOS transistor (such as PMOS transistors 102 and 110 in FIG. 1) is off (i.e., stops conducting) when a logic 1 level is asserted on the gate terminal and is on (conducts) when the gate terminal is driven to a logic 0 level. The opposite is true for NMOS transistors—a logic 0 voltage on the gate terminal turns an NMOS transistor off and logic 1 gate voltage turns the transistor on. The input signal 92 provided by powered digital logic 90 to the terminal 111 of PMOS transistor 110 functions as a control signal for the isolator 100. To operate the system in a mode in which digital logic circuits 80 and 90 both are powered on, control signal 92 preferably is driven high (logic 1). However, before digital logic circuit 80 is powered off, digital logic circuit 90 preferably drives control 92 low (logic 0) to isolate digital logic 90 from digital logic 80. Both modes of operation are described below.

When digital logic 80 is powered on, it drives data signal 82 through isolator 100 to output signal 94 which is provided to digital logic 90. In this mode, digital logic 90 drives control signal 92 to be a logic 1. With control signal 92 being a logic 1, transistor 110 is off and transistor 120 is on. With transistor 120 on, logic 1 on input signal 82 turns on transistor 130, thereby pulling output node 125 to logic 0. If input signal 82 is a logic 0, transistor 102 will be turned on, thereby pulling output node 125 high. As such, isolator 100 effectively operates as an inverter; output signal 94 will be at the opposite logic state from input signal 82. Digital logic 90 can include an inverter (not shown) to invert signal 94 back to the same logic as signal 82 if desired.

Before digital logic 80 is powered off, isolator 100 isolates signal 82 from digital logic 90. In this case, control signal 92 is driven low which turns on PMOS transistor 110 and turns off NMOS transistor 120. PMOS transistor 110 pulls node 125 to logic 1. Because NMOS transistor 120 is off, NMOS transistor 130 is isolated from output node 125. Accordingly, any electrical activity on transistor 130 will have no effect on output node 125. If PMOS transistor 102 somehow turns on, it can pull output node 125 to logic 1, which it already is due to transistor 110 being on. Alternatively, transistor 102 can be off and have no effect on output node 125. Thus, output node 125 remains at logic 1 regardless of logic state of signal 82, thereby isolating digital logic 90 from digital logic 80.

Figure 2:
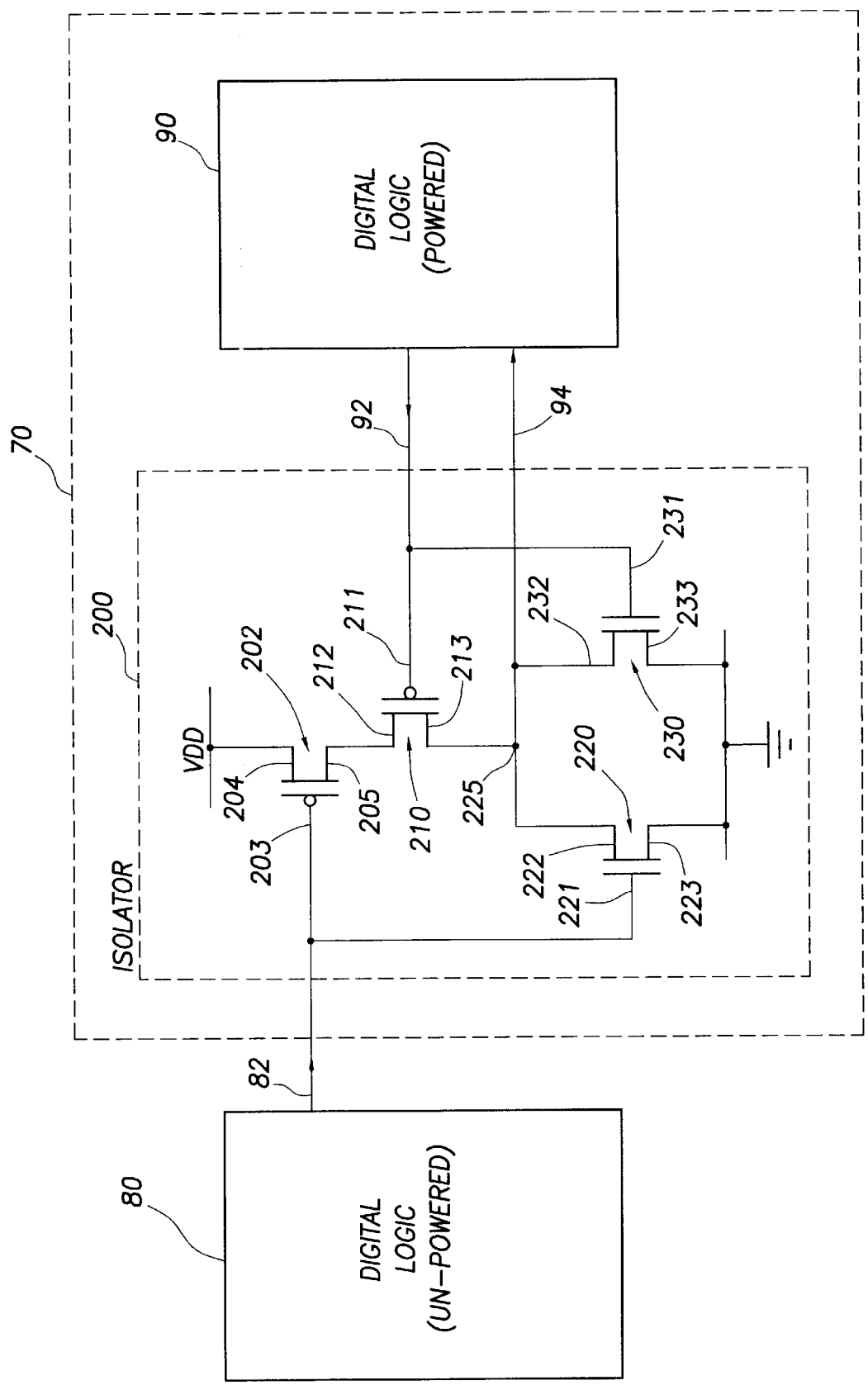
FIG. 2 shows another digital circuit in accordance with another embodiment of the invention.

Referring now to FIG. 2, an alternative digital isolator 200 is shown. Digital isolator 200 preferably comprises four transistors 202, 210, 220, and 230 connected as shown. Transistors 102 and 110 preferably are PMOS transistors while transistors 120 and 130 preferably are NMOS transistors. Given the function performed by digital isolator 100, one of ordinary skill in the art will recognize that other types of transistors can be substituted for transistors 202, 210, 220, and 230

In the embodiment of FIG. 2, input data signal 82 connects to the gate 203 of transistor 202. Terminal 104 preferably connects to voltage VDD generated by system 70. Terminals 223 and 233 of NMOS transistors 220 and 230 preferably connect to the ground potential of system 70 as shown. Terminal 205 of PMOS transistor 202 preferably connects to terminal 212 of PMOS transistor 210 and terminal 213 of PMOS transistor 210 preferably connects to terminals 222 and 232 of NMOS transistors 220 and 230 as shown. Node 225 is used as the output signal 94 of digital isolator 200. Finally, terminal 203 of PMOS transistor 202 connects to terminal 221 of NMOS transistor 220 and terminal 211 of PMOS transistor 210 connects to terminal 231 of NMOS transistor 230.

The particular digital isolation circuit 100 shown in FIG. 2 happens to be the circuit implementation of a logic NOR gate. However, the circuit preferably is not used to perform the Nor logic function, but instead is used to isolate digital logic circuit 80 from digital logic circuit 90.

Digital isolator 200 is used in the following manner. The input signal 92 provided by powered digital logic 90 to the terminal 211 of PMOS transistor 210 functions as the control signal for the isolator 200. In this embodiment, the control signal 92 is has the opposite logic state function as for the isolator 100 of FIG. 1. To operate the system in a mode in which digital logic circuits 80 and 90 both are powered on, control signal 92 preferably is driven low (logic 0). However, when digital logic circuit 80 is powered off, digital logic circuit 90 preferably drives control 92 high (logic 1) to isolate digital logic 90 from digital logic 80. Both modes of operation are described below.

When digital logic 80 is powered on, it drives data signal 82 through isolator 200 to output signal 94 which is provided to digital logic 90. In this mode, digital logic 90 drives control signal 92 to be a logic 0. With control signal 92 being a logic 0, transistor 210 is on and transistor 230 is off. If data signal 82 is a logic 0, transistor 202 will be on thereby pulling output node 225 high (logic 1). If data signal 82 is a logic 1, transistor 202 will be off and transistor 220 will be on thereby pulling output node 225 low (logic 0). As such, isolator 200 effectively operates as an inverter; output signal 94 will be at the opposite logic state from input signal 82. Digital logic 90 can include an inverter (not shown) to invert signal 94 back to the same logic as signal 82 if desired.

Before digital logic 80 is powered off, isolator 200 isolates signal 82 from digital logic 90. In this case, control signal 92 is driven high which turns on NMOS transistor 230, thereby pulling output node 225 low. Output node, and thus signal 94, will remain low no matter the state of signal 82. PMOS transistor 202 is isolated by transistor 210 (which is off) from output node 225. Because PMOS transistor 210 is off, any electrical activity on transistor 202 will have no effect on output node 125. Because NMOS transistor 230 is on and thus pulls output node 225 low and because transistor 210 is off, thereby isolating transistor 202 from the output node, output node 225 remains at logic 0 regardless of the logic state of signal 82, thereby isolating digital logic 90 from digital logic 80.

Although perhaps not readily apparent, it is preferable for the digital isolators input data signal 82 and control signal 92 to be connected as shown in the embodiments of FIGS. 1 and 2, rather than reversed. That is, preferably, control signal 92 is not connected to the gate 103 of PMOS transistor 102 in FIG. 1 and input data signal 82 is not connected to the gate 111 of PMOS transistor 110. Similarly, it preferably that control signal 92 is not connected to the gate 203 of PMOS transistor 202 in FIG. 2 and input data signal 82 is not connected to the gate 211 of PMOS transistor 210. This is preferably the case to ensure that transistors 120 (FIG. 1) and 210 (FIG. 2) which form one transistor of a commonly known "totem-pole" configuration effectively isolates the other pair of the totem-pole from the output node 125, 225. Referring to FIG. 1, any charge that might be present on transistor 130 as a result of digital logic 80 might be coupled to the output node 125 and cause a voltage change if transistor 120 was not off at all times during the isolation mode. This condition is ensured with signals 82 and 92 connected as shown. Similarly, connecting signals 82 and 92 as shown in FIG. 2 ensures that no charge associated with transistor 202 is coupled to output node 225. If signals 82 and 92 were reversed, then the voltage on the output node might experience a transient, but undesirable voltage change.

Figure 3:
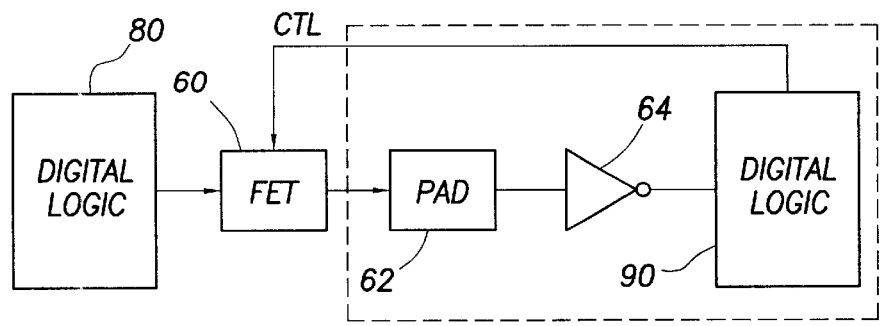
FIG. 3 shows a prior art connection scheme for two digital logic circuits.

FIGS. 3–7 illustrate various uses of either digital isolator 100 or 200. Referring first to FIG. 3, a conventional connection scheme is shown to interconnect two logic circuits 80 and 90. A field effect transistor ("FET") switch 60 is disposed between digital circuit 80 and a bonding pad 62. An inverter 64 also is typically included between the bonding pad 62 and the digital logic 90 to provide buffering and signal level compensation. The FET switch 60 is particularly useful if digital logic 80 is a "hot plug" device such as a peripheral component interconnect ("PCI") card. A hot plug device can be connected to the system even when the system is already powered on an operational. Typically, a FET switch 60 is provided for each data and power signal connecting digital logic 80 to the rest of the system. The switch 60 preferably is open (not conducting) until the system (e.g., digital logic 90) detects that a hot plug device 80 has been physically attached to the system. Then digital logic 90 asserts a control signal to close the switch 60 and electrically connect digital circuit 80 to digital circuit 90. As one of ordinary skill in the art would know, FET switch 60 typically is provided as a discrete component on the motherboard and not implemented in an ASIC such as digital logic 90, which might be implemented as an ASIC. This is because FET switch 60 typically carries electrical current on the order of 2–24 milli-amps which necessitates a relatively large transistor. In fact, a FET switch 60 may be thousands of times larger than a typical internal ASIC core transistor. To integrate the FET switch 60 into an ASIC would require a large amount of die area and custom layout which is generally not feasible. Typically, hundreds of such FET switches are included which occupy significant space on the mother board and adds significant cost to the system. Further, each FET 60 must be soldered or otherwise attached to the board. Each solder joint is susceptible to malfunctioning over time thereby reducing the reliability of the system.

Figure 4:
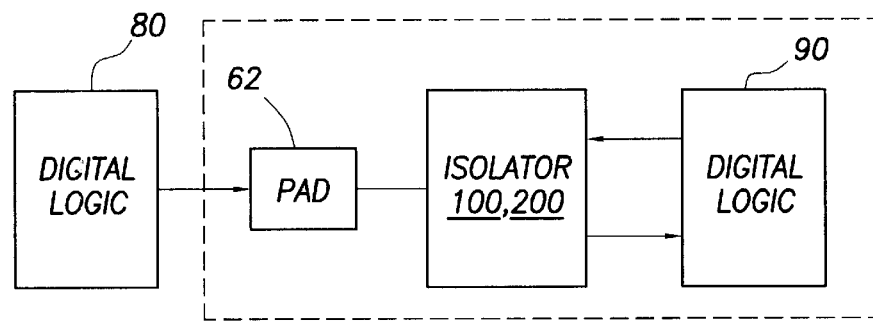
FIG. 4 shows a use of the digital isolation circuit of the preferred embodiment of the invention.

An additional advantage of digital isolators 100, 200 is illustrated in FIG. 4. As shown, an isolator 100 or 200 is placed in between bonding pad 62 and digital logic 90. With digital isolator 100 or 200, FET switch 60 and inverter 64 are not necessary and can be eliminated altogether as shown. The transistors comprising isolators 100 and 200 typically carry current on the order of micro-amps and as such are much smaller than FET 60 and thus can be easily implemented in an ASIC. Because isolators 100, 200 can easily be implemented as part of a standard ASIC, significant cost and motherboard space are saved and reliability is increased.

Figure 5:
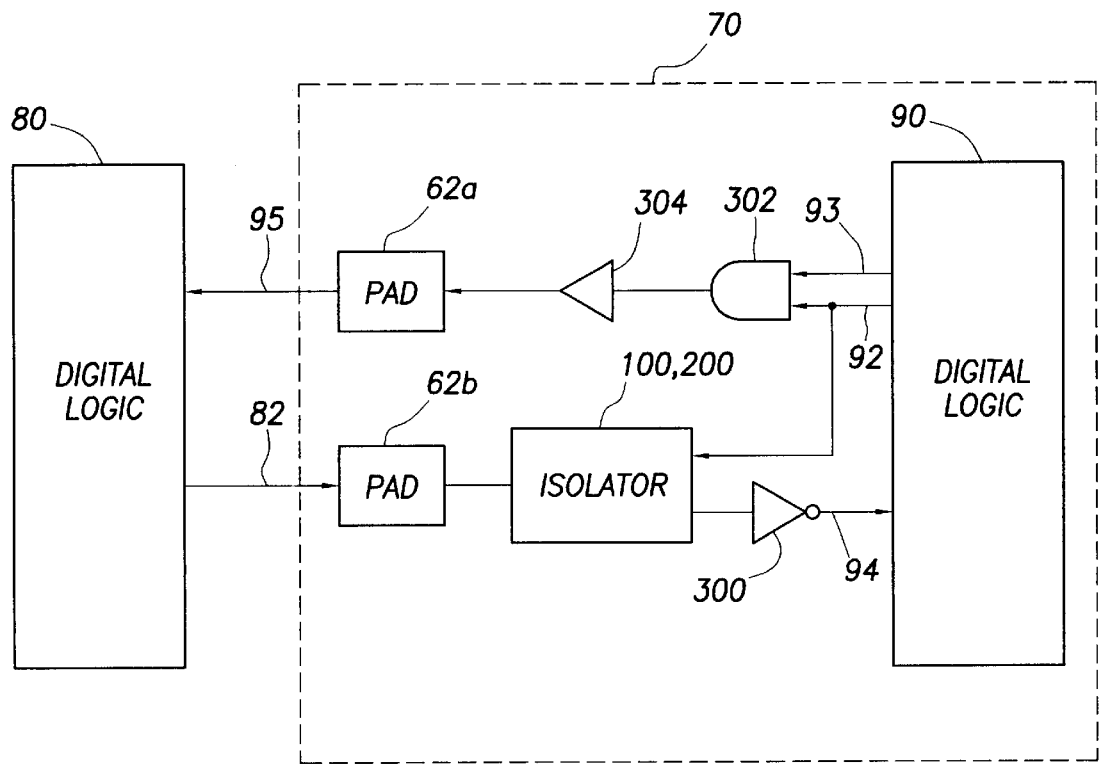
FIG. 5 shows a use of the digital isolation circuit in a uni-directional, point-to-point interconnect topology.
Figure 6:
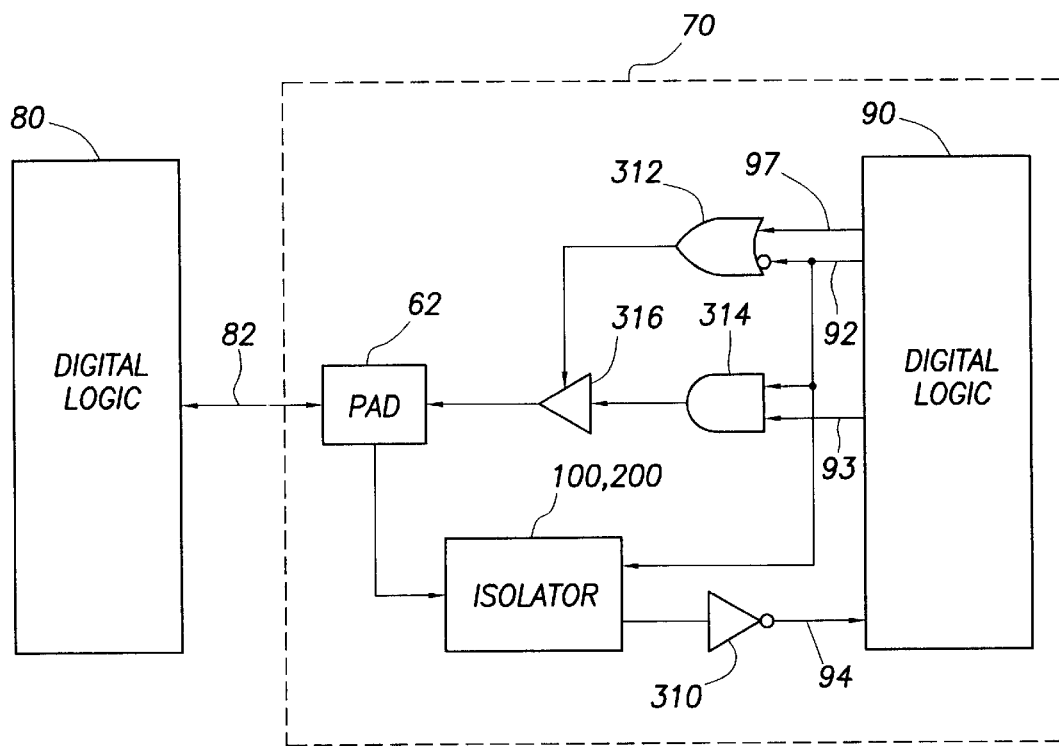
FIG. 6 shows a use of the digital isolation circuit in a bi-directional, point-to-point interconnect topology.
Figure 7:
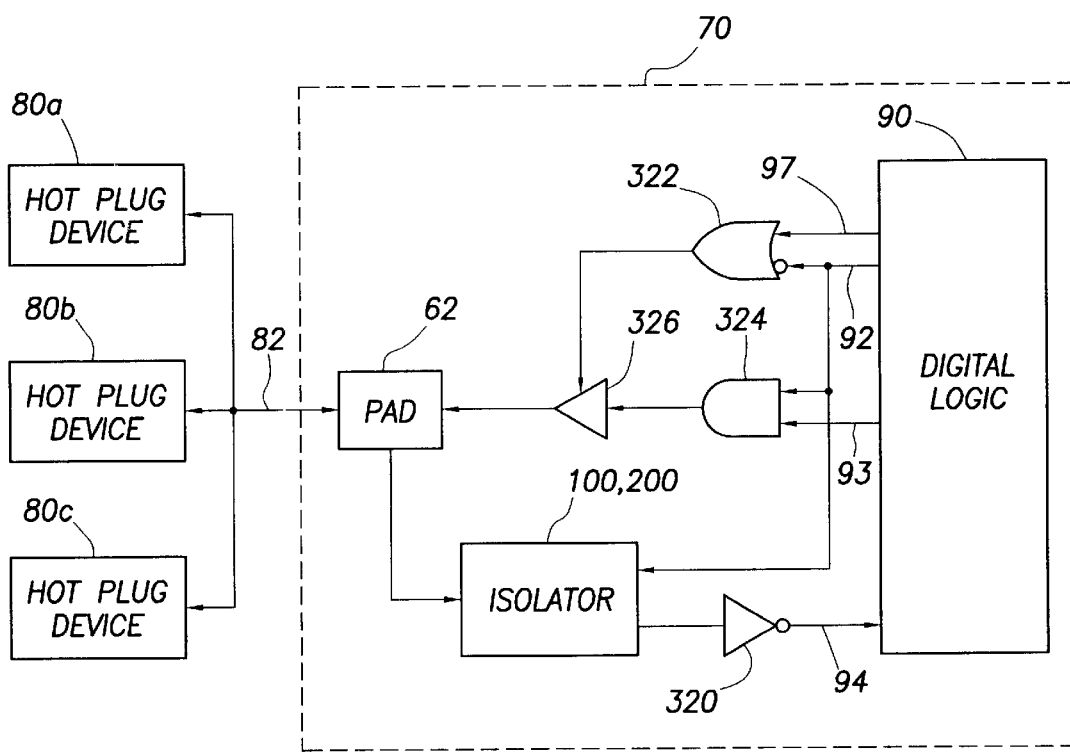
FIG. 7 shows a use of the digital isolation circuit to isolate hot plug devices on a bi-directional, shared bus interconnect topology.

FIGS. 5–7 illustrate other variations on the use of the digital isolator. In the examples of FIGS. 5–7, digital logic 80 is assumed to be a hot plug device, but it should be appreciated that digital logic 80 does not have to be hot pluggable. In FIG. 5, a uni-directional, point-to-point interconnection topology is shown coupling digital logic 80 to digital logic 90. The connection circuitry includes two bonding pads 62a and 62b, an isolator 100 or 200 (as described above), an inverter 300, an AND gate 302 and a driver 304. Signal 82 is driven by hot plug logic 80 through bonding pad 62b, isolator 100 or 200 and inverter 300 to digital logic 90 as signal 94. As described above, digital logic 90 asserts the control signal 92 which is provided both to AND gate 302 an isolator 100, 200. If no hot plug device 80 is present in the system, digital logic 90 preferably asserts control signal 92 to a logic 0 which causes isolator 100, 200 to isolate signal 82 from logic 90. A logic 0 on control signal 92 also causes the output of AND gate 302 to be low thereby pulling the voltage on signal line 95 low. When the system detects that a hot plug device 80 is inserted into the system, digital logic 90 pulls the control signal 92 high thereby effectively turning isolator 100, 200 into an inverter and permitting the digital logic 90 to assert a data signal 93 through AND gate 302, driver 304, and bonding pad 62a to digital logic 80 via signal line 95. Thus, two-way communication is possible over the uni-directional data paths shown.

In FIG. 6, a bi-directional path is implemented using a digital isolator 100 or 200. Data transmissions to and from hot plug logic 80 pass through the bonding pad 62. An inverter 310 couples the isolator 100, 200 to the digital logic 90 and the isolator also connects to the bonding pad 62. As such, one data path from logic 80 to logic 90 includes bonding pad 62, isolator 100, 200 and inverter 310. The isolator 100, 200 functions as described above to isolate signal 82 to digital logic 90.

The opposite direction data path includes OR gate 312, AND gate 314, driver 316 and pad 62. The data signal 93 from logic 90 is provided to one terminal of AND gate 314 along with the control signal 92 which also couples to OR gate 312. A second control signal 97 from digital logic 90 is provided to the other terminal of OR gate 312. This second control signal 97 is used to control driver 316 to permit data signal 93 to flow through AND gate 314 and driver 316 to digital logic 80.

FIG. 7 is similar to FIG. 6. The difference is that hot plug device 80 has been replaced with a plurality of hot plug devices 80a, 80b, and 80c. This embodiment represents a shared bus topology in which the three hot plug devices 80a–80c share a common bus 82 which isolated from digital logic 90 by an isolator 100, 200. Alternatively, three separate busses 82 could be provided, one for each hot plug device. As such, a separate isolator 100 or 200 would be preferred for each such bus. Further, the collection of components: pad 62, isolator 100, 200, inverter 300, OR gate 322, AND gate 324, and driver 326 would be replicated for each such bus.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. The computers A computer system, comprising:
   a first digital logic circuit;
   a second digital logic circuit;
   a digital isolator coupled to said first and second digital logic circuit, said isolator isolating said first digital logic circuit from said second digital logic circuit when said first digital logic circuit is powered off and said second digital logic circuit is powered on; and
   at least one input/output device;
   wherein said digital isolator couples to a first data signal from the first digital logic circuit and a second data signal from the second digital logic circuit and, when said first digital logic circuit is powered on, said digital isolator inverts said first data signal and provides said inverted signal to said second data signal.

2. A computer system, comprising:
   a first digital logic circuit;
   a second digital logic circuit;
   a digital isolator coupled to said first and second digital logic circuit, said isolator isolating said first digital logic circuit from said second digital logic circuit when said first digital logic circuit is powered off and said second digital logic circuit is powered on; and
   at least one input/output device;
   wherein said digital isolator couples to a first data signal from the first digital logic circuit and both a second data signal and a control signal from the second digital logic circuit, said control signal determines whether the digital isolator functions as an inverter or an isolator.

3. The computer system of claim 2 wherein said digital isolator includes a first, a second, a third and a fourth transistor, said transistors having gate terminals and the gate of said first transistor connects to said first data signal and the gate of said second transistor connects to said control signal and the third transistor connects to said first and second transistors at a connection node which is an output terminal of said digital isolator.

4. The computer system of claim 3 wherein said first arid second transistors comprise PMOS transistors.

5. The computer system of claim 3 wherein said first and second transistors comprise NMOS transistors.

6. The computer system of claim 3 wherein the gate of said third transistor also connects to said control signal and the gate of said fourth transistor connects to said first data signal.

7. The computer system of claim 6 wherein said third and fourth transistors are connected in a totem-pole configuration.

8. The computer system of claim 2 wherein said digital isolator includes a first, a second, a third and a fourth transistor, said transistors having gate terminals and the gate of said first transistor connects to said first data signal and the gate of said second transistor connects to said control signal and the second transistor connects to said third and fourth transistors at a connection node which is an output terminal of said digital isolator.

9. The computer system of claim 8 wherein said first and second transistors comprise PMOS transistors.

10. The computer system of claim 8 wherein said first and second transistors comprise NMOS transistors.

11. The computer system of claim 8 wherein the gate of said third transistor also connects to said first data signal and the gate of said fourth transistor connects to said control signal.

12. The computer system of claim 11 wherein said first and second transistors are connected in a totem-pole configuration.

13. A computer system, comprising:
    a first digital logic circuit;
    a second digital logic circuit;
    a digital isolator coupled to said first and second digital logic circuit, said isolator isolating said first digital logic circuit from said second digital logic circuit when said first digital logic circuit is powered off and said second digital logic circuit is powered on; and
    at least one input/output device;
    wherein said digital isolator comprises a NAND gate.

14. A computer system, comprising:
    a first digital logic circuit;
    a second digital logic circuit;
    a digital isolator coupled to said first and second digital logic circuit, said isolator isolating said first digital logic circuit from said second digital logic circuit when said first digital logic circuit is powered off and said second digital logic circuit is Powered on; and
    at least one input/output device;
    wherein said digital isolator comprises a NOR gate.

15. A digital isolation circuit interconnecting a first digital logic circuit and a second digital logic circuit, comprising:
    a plurality of transistors interconnected so as to isolate said first digital logic circuit from said second digital logic circuit when said first digital logic circuit is powered off and said second digital logic circuit is powered on.

16. The digital isolation circuit of claim 15 wherein said digital isolation circuit couples to a first data signal from the first digital logic circuit and a second data signal from the second digital logic circuit and, when said first digital logic circuit is powered on, said digital isolation circuit inverts said first data signal and provides said inverted signal to said second data signal.

17. The digital isolation circuit of claim 15 wherein said digital isolation circuit couples to a first data signal from the first digital logic circuit and both a second data signal and a control signal from the second digital logic circuit, said control signal determines whether the digital isolation circuit functions as an inverter or an isolator.

18. The digital isolation circuit of claim 17 wherein said transistors comprise a first, a second, a third and a fourth transistor, said transistors having gate terminals and the gate of said first transistor connects to said first data signal and the gate of said second transistor connects to said control signal and the third transistor connects to said first and second transistors at a connection node which is an output terminal of said digital isolation circuit.

19. The digital isolation circuit of claim 18 wherein said first and second transistors comprise PMOS transistors.

20. The digital isolation circuit of claim 18 wherein said first and second transistors comprise NMOS transistors.

21. The digital isolation circuit of claim 18 wherein the gate of said third transistor also connects to said control signal and the gate of said fourth transistor connects to said first data signal.

22. The digital isolation circuit of claim 17 wherein said third and fourth transistors are connected in a totem-pole configuration.

23. The digital isolation circuit of claim 22 wherein said transistors include a first, a second, a third and a fourth transistor, each of said four transistors having gate terminals and the gate of said first transistor connects to said first data signal and the gate of said second transistor connects to said control signal and the second transistor connects to said third and fourth transistors at a connection node which is an output terminal of said digital isolator.

24. The digital isolation circuit of claim 23 wherein said first and second transistors comprise PMOS transistors.

25. The digital isolation circuit of claim 23 wherein said first and second transistors comprise NMOS transistors.

26. The digital isolation circuit of claim 23 wherein the gate of said third transistor also connects to said first data signal and the gate of said fourth transistor connects to said control signal.

27. The digital isolation circuit of claim 26 wherein said first and second transistors are connected in a totem-pole configuration.

28. The digital isolation circuit of claim 15 wherein said transistors comprise four transistors connected so as to comprise a NAND gate.

29. The digital isolation circuit of claim 15 wherein said transistors comprise four transistors connected so as to comprise a NOR gate.

30. A computer system having hot plug capability, comprising:

an ASIC including digital logic and a digital isolator;

a hot plug logic device that can be coupled to said ASIC when said ASIC is powered on;

said hot plug logic device coupled to said ASIC without a discrete switching transistor therebetween.

31. The computer system of claim 30 further including a bonding pad between said hot plug logic and said ASIC and said digital isolator is located between said bonding pad and said ASIC.

32. The computer system of claim 30 wherein said digital isolator couples to a first data signal from the hot plug logic and a second data signal from the ASIC's digital logic and, when said hot plug logic is powered on, said digital isolator inverts said first data signal and provides said inverted signal to said second data signal.

33. The computer system of claim 30 wherein said digital isolator couples to a first data signal from the hot plug logic and both a second data signal and a control signal from the ASIC's digital logic, said control signal determines whether the digital Isolator functions as an inverter or an isolator.

34. The computer system of claim 33 wherein said digital isolator includes a first, a second, a third and a fourth transistor, said transistors having gate terminals and the gate of said first transistor connects to said first data signal and the gate of said second transistor connects to said control signal and the third transistor connects to said first and second transistors at a connection node which is an output terminal of said digital isolator.

35. The computer system of claim 34 wherein said first and second transistors comprise PMOS transistors.

36. The computer system of claim 34 wherein said first and second transistors comprise NMOS transistors.

37. The computer system of claim 34 wherein the gate of said third transistor also connects to said control signal and the gate of said fourth transistor connects to said first data signal.

38. The computer system of claim 37 wherein said third and fourth transistors are connected in a totem-pole configuration.

39. The computer system of claim 33 wherein said digital isolator includes a first, a second, a third and a fourth transistor, said transistors having gate terminals and the gate of said first transistor connects to said first data signal and the gate of said second transistor connects to said control signal and the second transistor connects to said third and fourth transistors at a connection node which is an output terminal of said digital isolator.

40. The computer system of claim 39 wherein said first and second transistors comprise PMOS transistors.

41. The computer system of claim 39 wherein said first and second transistors comprise NMOS transistors.

42. The computer system of claim 39 wherein the gate of said third transistor also connects to said first data signal and the gate of said fourth transistor connects to said control signal.

43. The computer system of claim 42 wherein said first and second transistors are connected in a totem-pole configuration.

44. The computer system of claim 30 wherein said digital isolator comprises a NAND gate.

45. The computer system of claim 30 wherein said digital isolator comprises a NOR gate.

* * * * *